(12) United States Patent
Yu

(10) Patent No.: US 6,486,011 B1
(45) Date of Patent: Nov. 26, 2002

(54) JFET STRUCTURE AND MANUFACTURE METHOD FOR LOW ON-RESISTANCE AND LOW VOLTAGE APPLICATION

(75) Inventor: Ho-Yuan Yu, Saratoga, CA (US)

(73) Assignee: Lovoltech, Inc., Santa Clara, CA (US)

( * ) Notice: Subject to any disclaimer, the term of this patent is extended or adjusted under 35 U.S.C. 154(b) by 0 days.

(21) Appl. No.: 09/690,703

(22) Filed: Oct. 16, 2000

Related U.S. Application Data

(63) Continuation of application No. 09/430,500, filed on Oct. 29, 1999, now Pat. No. 6,251,716
(60) Provisional application No. 60/115,009, filed on Jan. 6, 1999.

(51) Int. Cl.[7] .............................................. H01L 21/337
(52) U.S. Cl. ....................... 438/186; 438/186; 438/188; 438/193; 438/194; 438/195; 438/142; 257/134; 257/256; 257/287; 257/350
(58) Field of Search ..................... 438/186–88, 193–95, 438/142; 257/134, 256, 287, 350

(56) References Cited

U.S. PATENT DOCUMENTS

| | | | | |
|---|---|---|---|---|
| 4,750,023 A | * | 6/1988 | Shannon | 357/23.3 |
| 4,769,685 A | * | 9/1988 | MacIver et al. | 357/23.4 |
| 5,396,085 A | * | 3/1995 | Baliga | 257/77 |
| 6,090,650 A | * | 7/2000 | Dabral et al. | 438/195 |
| 6,180,519 B1 | * | 1/2001 | Kuroi et al. | 438/649 |

* cited by examiner

Primary Examiner—Matthew Smith
Assistant Examiner—Granvill D Lee, Jr.
(74) Attorney, Agent, or Firm—Wagner, Murabito & Hao LLP

(57) ABSTRACT

This invention discloses the present invention discloses a junction field effect transistor (JFET) device supported on a substrate. The JFET device includes a gate surrounded by a depletion region. As the distance between the gates is large enough, there is a gap between the depletion regions surrounding adjacent gates. Depletion mode JFET transistor which is normally on is provided. The normally on transistors respond to negative bias applied to the gates to shut of the current path in the substrate. The current path in the substrate is normally available with a zero gate bias. As the distance between the gates is reduced, the JFET transistor is normally off because the depletion regions surround the gates shut of the current channel. The depletion region responding to a positive bias applied to the gate to open a current path in the substrate wherein the current path in the substrate is shut off when the gate is zero biased. The normally on and normally off JFET transistors are configured to achieve low voltage drop, low on resistance, high current density and high frequency operations.

20 Claims, 34 Drawing Sheets

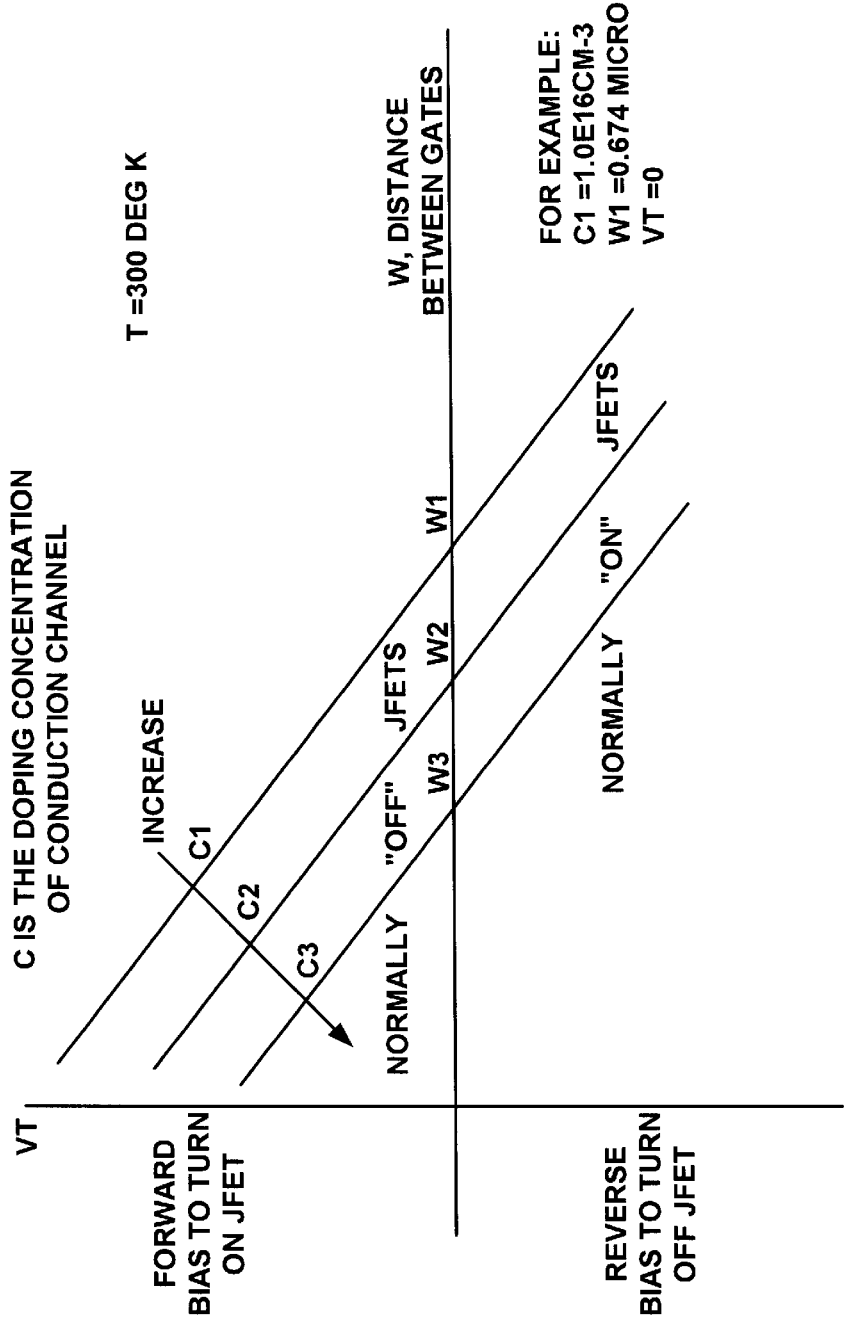
FIGURE 9 THRESHOLD VOLTAGE VERSUS DISTANCE W AND CHANNEL DOPING CONCENTRATION

JFET STRUCTURE AND MANUFACTURE METHOD FOR LOW ON-RESISTANCE AND LOW VOLTAGE APPLICATION

This is a continuation of application(s) Ser. No. 09/430,500 filed on Oct. 29, 1999 now U.S. Pat. No. 6,251,716 which is hereby incorporated by reference to this specification which designated the U.S.

BACKGROUND OF THE INVENTION

1. Field of the Invention

This invention relates generally to the structure and fabrication process for manufacturing the junction field effect transistors (JFET). More particularly, this invention relates to a novel device structure and fabrication process for manufacturing normally on or normally off JFET transistors with low on-resistance for low voltage and high current density applications.

2. Description of the Prior Art

The semiconductor industry now faces a difficult challenge to satisfy the ever increased needs for providing transistors suitable for power management with voltage under three-volts. As the feature sizes of the integrated circuits (ICs) are becoming ever smaller and electronic devices are continuously being miniaturized, the voltages from AC or DC power sources for providing power to these devices are further dropped. Dropping the voltage from five volts to three volts results in a 25:9 reduction in power if the current density is maintained unchanged. At 1.8 volts, the power drops another 60%. However, the transient current loads can be very high. Under such operation conditions, the normal forward voltage drop for a p-n junction typically employed in a rectifier is about 0.9 volts. Most of the power will be consumed in the rectifying process. Power supply systems built with such types of p-n junctions would no longer be suitable for the low voltage applications. Even the Schottky barrier diodes with a forward voltage drop below 0.5 volts would not be a suitable solution to provide rectifiers or power switching devices for operation under the low voltage conditions.

The concept of junction filed effect transistors (JFETs) has been disclosed after the invention of the bipolar transistors. JFET transistor can be operated at very high frequency with high switching speed because the JFET transistors are operated with majority carriers. The JFET transistor are well known and employed commonly in a naturally on state when the gate bias is zero. Because of the naturally on state, the JFET transistor are not as widely used in the semiconductor industry as the MOSFET, i.e., the metal oxide semiconductor field effect transistors. In order to make the JFET transistors to operate in a naturally off state, the distance between the gates has to be reduced for the depletion regions from the gate to shut off the current conducting paths. Such naturally off JFET transistors are however not very useful in their conventional configurations due to the longer current channel thus limiting the current capacity with a high on-resistance. S. M. Sze in "Physics of Semiconductor Devices" disclosed one example of such configuration (John Wiley & Son, 1981 Second Edition, page 322). The normally off JFET transistors discussed by Sze are for high speed low power applications. The long current channel and high-on resistance limit the usefulness of JFET transistors particularly the high on-resistance prevents such transistors for application in modern electronic devices operated with extreme low voltages.

In U.S. Pat. No. 4,523,111 entitled "Normally-Off Gate-Controlled Electric Circuit with Low On-Resistance", Baliga disclosed a JFET serially connected to an IGFET. The gate of IGFET is operated as the gate for the serially connected circuit. The gate of IGFET is applied to block the current to flow through a normally on JFET until the IGFET is turned on with a positively biased voltage above an IGFET threshold voltage. The on-resistance is the sum of the JFET resistance and the IGFET resistance. The on-resistance would not be adequate for extreme-low voltage applications required by modern electronic devices as discussed above. A similar invention is disclosed in U.S. Pat. No. 4,645,957 that is entitled "Normally Off Semiconductor Device with Low On-Resistance and Circuit Analogue" by Baliga. The JFET transistor is serially connected to a bipolar transistor to achieve the normally off state. Again, the on-resistance is the sum of the bipolar resistance and the JFET resistance and becomes too high for modern application to modern devices operated with extremely low voltages.

In U.S. Pat. No. 5,321,283 entitled "High Frequency JFET" Cogan et al. disclose a JFET for radio frequency (RF) operation at high frequency. The normally-on JFET transistors disclosed in this patent are operated with high voltage and not suitable to satisfy the requirements of modern portable electronic devices that require extremely low voltage and relatively high current capacity. Similarly, in U.S. Pat. No. 5,618,688 entitled "Method of Forming a Monolithic Semiconductor Integrated Circuit having an N-Channel JFET", Ruess et al disclose a normally on JFET transistor manufactured with BiCMOS processes. The JFET transistors disclosed in this patent are not suitable for low voltage and high current applications.

Therefore, a need still exits in the art of design and manufacture of transistor for low voltage power supply to provide a novel structural configuration and fabrication process that would resolve these difficulties. More specifically, it is preferably that the transistor for low voltage power supply has low on-resistance and high switching speed. It is further desirable to employ a simplified manufacture process to fabricate the power transistors such that highly reliable power transistors can be made available at a reasonably low production cost.

SUMMARY OF THE PRESENT INVENTION

It is therefore an object of the present invention to provide new device structures and manufacture methods. The conventional JFET transistors, which are normally on with negatively biased off, are now provided with unconventional device structures such that the new JFET transistors are operated with low on-resistance and high current capacity that can be either normally on or normally off by arranging the distance between the gates. The unconventional JFET transistors of this invention provide special advantages for low-voltage low-resistance applications such that aforementioned limitations and difficulties as encountered in the prior art can be overcome.

Specifically, it is an object of the present invention to provide a new device structure and manufacture method to provide an unconventional JFET transistor with flexibly on-off adjustment. When the distance between the gates is sufficiently large, the JFET transistors are normally on with zero gate bias. As the distance between the gates is sufficiently small, the depletion regions from the gates fills the conduction paths between the gates thus the conduction paths are shut off and the JFET transistors are normally off with a zero gate bias and turned on with positive gate bias voltage. A positive or negative bias voltage applied to the gate causes the depletion regions surrounding the gate to shrink and open up the channel for current to pass through. Very low resistance current path is provided. Low voltage and high current density can be achieved by applying to the normally-off-positively-biased-on or normally-on-negatively-biased-off JFET transistors.

Another object of the present invention is to a new device structure and manufacture method for providing JFET transistors that can be flexibly configured by an unconventional device structure such that the JFET transistors can be either normally-off-positively-biased-on or normally-on-negatively-biased-off. The JFET transistors configured with unconventional structures are formed with low on-resistance, high current capacity and high switching speed. In a preferred embodiment, a horizontal JFET device is manufactured with standard CMOS processes with top and bottom gates controlling the drain to source current.

Another object of the present invention is to provide a new device structure and manufacture method for providing JFET transistors that can be flexibly configured by an unconventional device structure such that the JFET transistors can be either normally-off-positively-biased-on or normally-on-negatively-biased-off. In a preferred embodiment, a Schottky barrier is used as the top gate to achieve high switching speed. The barrier height is adjusted by controlling the implant dopant concentration or using different metal silicon or silicide/silicon systems.

Another object of the present invention is to provide a new device structure and manufacture method for JFET transistors that can be flexibly configured by an unconventional device structure such that the JFET transistors can be either normally-off-positively-biased-on or normally-on-negatively-biased-off. In a preferred embodiment, a deep implanted gate is formed in a multiple resistivity layers to provide gate control channel and to reduce the resistance of the drain/source ohmic contacts.

Another object of the present invention is to provide a new device structure and manufacture method for providing JFET transistors that can be flexibly configured by an unconventional device structure such that the JFET transistors can be either normally-off-positively-biased-on or normally-on-negatively-biased-off. In a preferred embodiment, a vertical gate pillar is used for a horizontal JFET transistor. The gate pillars can control the current flowed between deeper source and drain regions. Greater current density can be controlled without requiring greater silicon areas thus reducing the semiconductor real estate requirement for power transistor used for large current applications.

This invention is based on Applicant's disclosures filed in the United States Patent and Trademark Office under the Disclosure Document Program. The disclosures filed are: 1) "Low On Resistance Transistors and the Method of Making" #444899 filed on Sep. 24, 1998 and 2) "Novel Structure of JFETs for Low Voltage Applications" #444,874 filed on Sep. 17, 1998. This invention provides the advantages of low forward voltage drops between the source and drain. The voltage drops can be reduced to 0.1 volts or less and a current over 100 amperes for large size chips can also be achieved.

Briefly, in a preferred embodiment, the present invention discloses a junction field effect transistor (JFET) device supported on a substrate. The JFET device includes a gate surrounded by a depletion region. For a normally on JFET transistor, the depletion regions respond to a negative bias applied to the gate to turn off the current path. For a normally off JFET transistor, the depletion region responds to a positive bias applied to the gate to open a current path in the substrate wherein the current path in the substrate is shut off when the gate is zero biased. Special configurations are disclosed for normally on and normally off JFET transistors to shorten the current channels and to achieve low on-resistance, high current density and high switching speed.

The present invention also discloses a method for manufacturing a junction field effect transistor (JFET) device. The method includes the steps of a) forming a plurality of gates separated by a distance W wherein a depletion region surrounds each gate. And, b) adjusting a threshold voltage for the JFET transistor by gradually increasing a channel doping concentration near the depletion regions surrounding the gates for gradually decreasing the threshold voltage for the JFET transistor. In a preferred embodiment, the step of gradually increasing a channel doping concentration near the depletion regions surrounding the gates for gradually decreasing the threshold voltage is a step of making the JFET transistor with a threshold voltage greater than zero for providing a normally on JFET transistor. In a different preferred embodiment, the step of gradually increasing a channel doping concentration near the depletion regions surrounding the gates for gradually decreasing the threshold voltage is a step of making the JFET transistor with a threshold voltage equal or less than zero for providing a normally on JFET transistor. The distance, W, between gates can be determined by lithography, etch, and/or thermal process and can be reduced by RTA thermal process for threshold voltage adjustment prior to metalization.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 9 shows a graph of the relationship between threshold voltage, distance W, and channel doping concentration.

DETAILED DESCRIPTION OF THE PREFERRED EMBODIMENT

For the purpose of providing background information of this invention, FIGS. 1A to 1D of conventional configuration and operational characteristics are explained first. The junction field effect transistor (JFET) first proposed by Shockley in 1952 as a depletion mode device. The transistor is normally in an on-state, i.e., a freely conducting state. Applying a voltage of suitable polarity, i.e., a reverse bias, to the gate turns off the transistor. The reverse voltage biases the gate-channel pn-junction and expands the depletion layer. The cross sectional area of the effective conducting channel is reduced and the resistance is increased. For an n-channel transistor as that shown in FIG. 1B, a negative voltage applied to the gate will pinch off the conduction channel between the source and drain. Conversely, in a p-channel transistor, a positive voltage applied to the gate will pinch off the conduction channel.

Figure 1A:
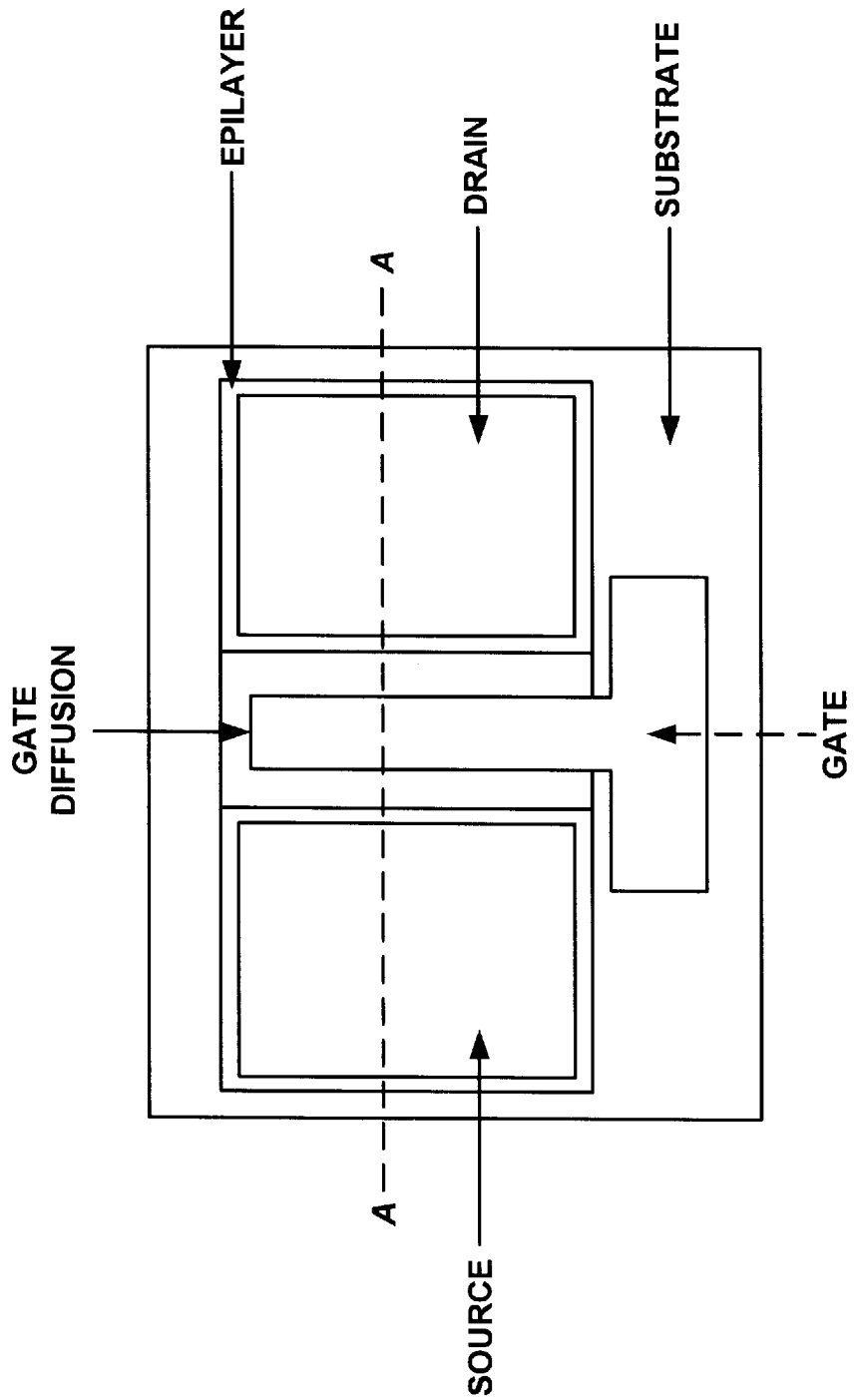
FIGS. 1A and 1B are respectively a top view and a cross sectional view of a conventional junction field effect transistor (JFET)
Figure 1B:
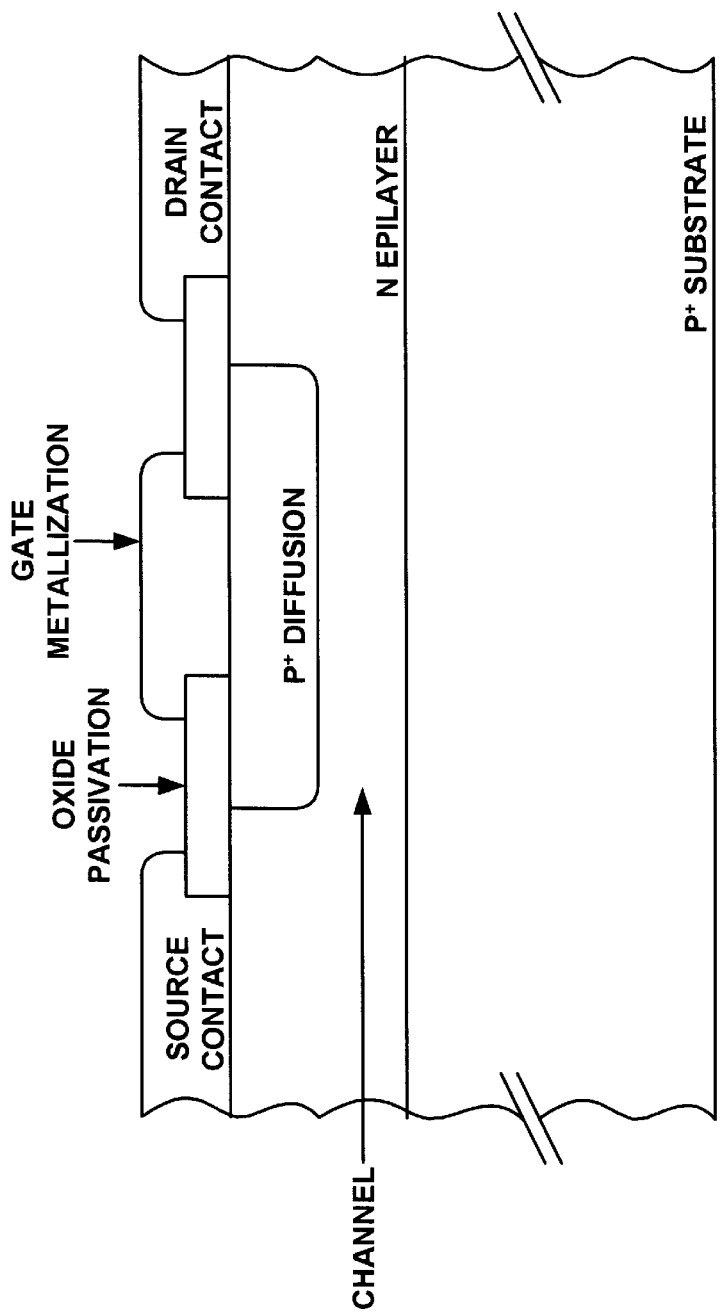
Figure 1C:
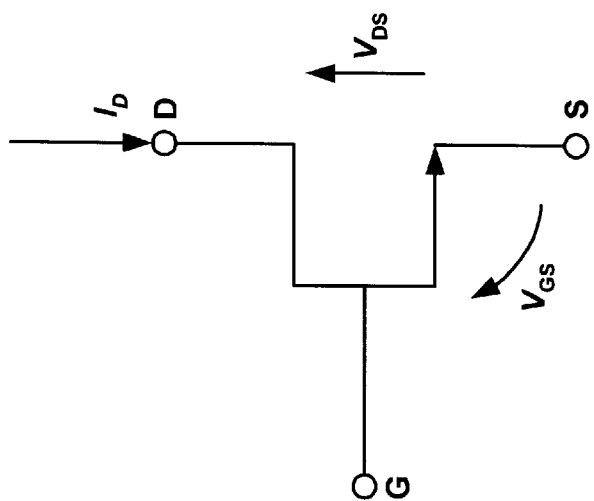
FIG. 1C is an equivalent circuit and FIG. 1D is a current voltage diagram of the JFET transistor of FIGS. 1A and 1B.
Figure 1D:
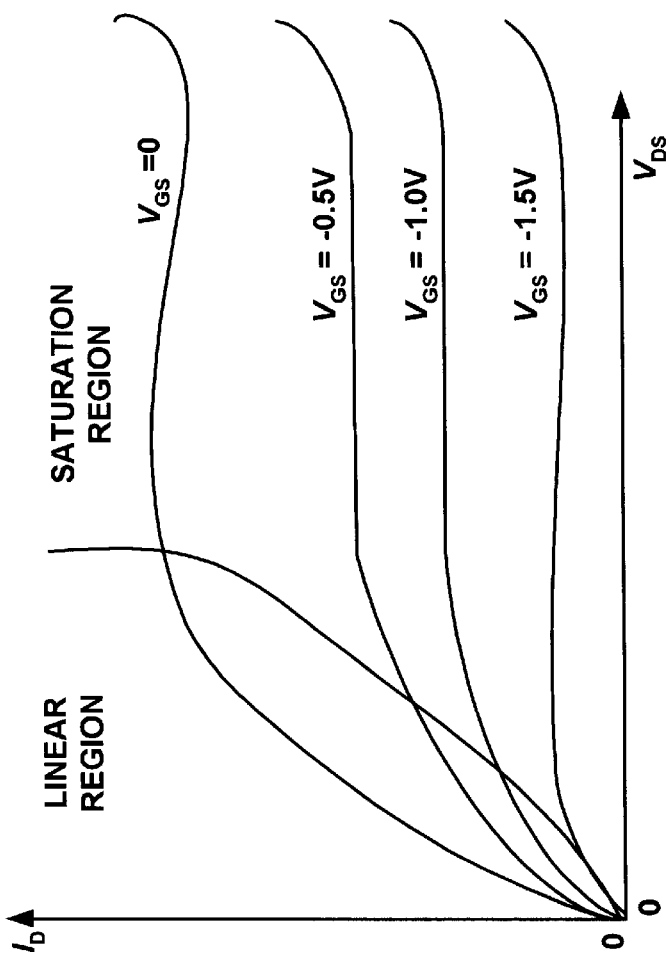
Figure 2:
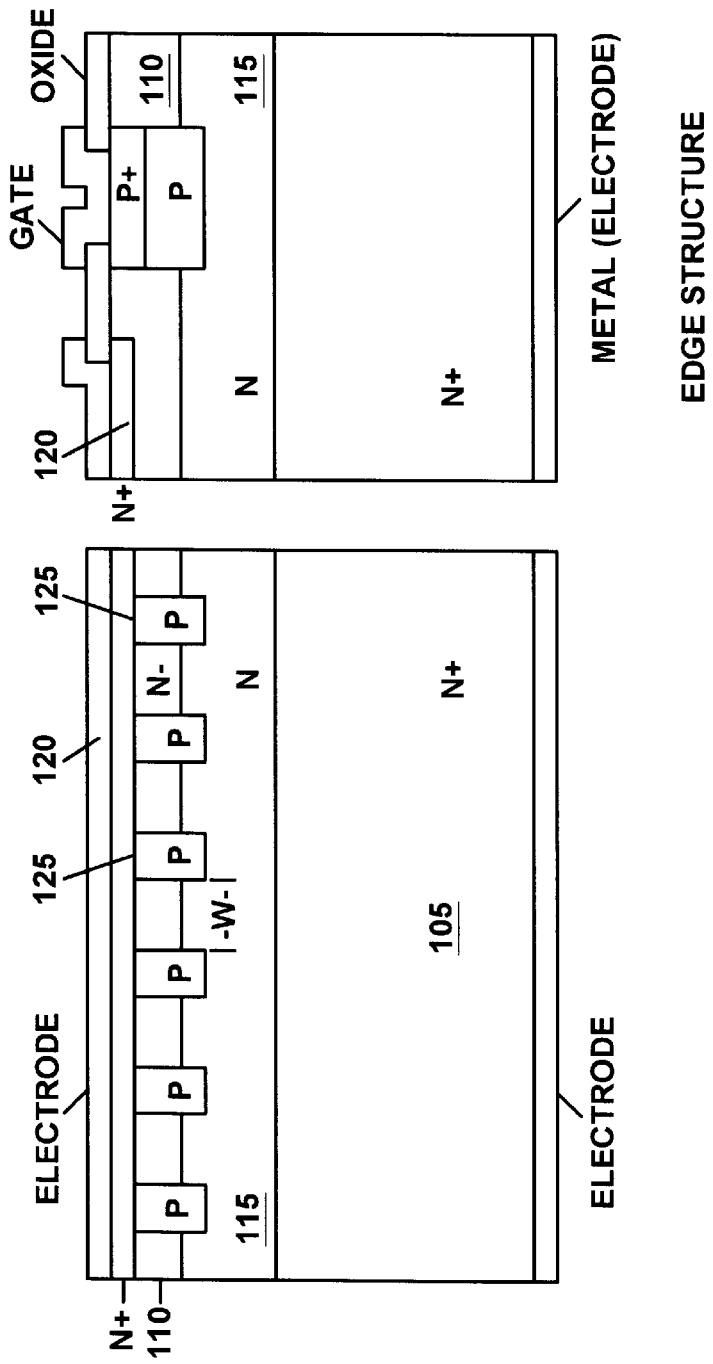
FIG. 2 shows a cross sectional view of a JFET device for low voltage applications that is either normally-off-positively-biased-on or normally-on-negatively-biased-off JFET device.

FIG. 2 shows a novel vertical JFET device 100 of this invention. The JFET device 100 is formed on a N+ substrate 105. The N+ substrate 105 has a resistivity ranging from 0.005 to 0.01 ohm/cm. A two-layer epitaxial structure includes a N-epitaxial layer 110 with a doping concentration ranging from $5 \times 10E13/cm3$ to $5 \times 10E17/cm3$ and a N-epitaxial layer 115 with a doping concentration ranging from $1 \times 10E13/cm3$ to $5 \times 10E16/cm3$ is supported on the N+ substrate 105. The range of the doping concentration is depends on the device structure and the tradeoff between the forward voltage drop and the reverse blocking voltage. Applying a blank phosphorous implant with an ion flux 10E14 to 10E15/cm2 of 40 Kev forms a top N layer 120. The N-layer 120 has a doping concentration about 10E16/cm3 and an the thickness of the layers 110, 115, and 120 can range between 200 Angstroms to four microns depending on the design and the application of the device. An oxidation layer is then formed on top of the N-layer 120 either by thermal oxidation or a chemical vapor deposition (CVD) silicon dioxide deposition process. Then, a plurality of implant windows are opened by employing a photolithography and etch processes. A boron implant with ion flux of 10E13 to 10E15/cm2 of ion energy ranging from 125 Kev to 1.0 Mev is carried out through these implant windows to form an array of p-regions 125. A distance X is provided between these p-regions. The p-regions 125 are formed by a deep boron implant and implant annealing.

When X is sufficient large, the device is a normally on JFET transistor. If the X is a sufficiently small, when the gate has a zero bias, the depletion region of the gate shuts off the electrode. Under a forward bias voltage that is above the threshold voltage VT, the gate starts to open and the current flow between the electrodes under extremely low resistance. When the dopant concentration of the N-region 115 is 10E16/cm3, and the silicon region 115 has a resistivity around 0.5 ohm-cm, under normal zero bias condition, the depletion region from each side of the p-region 125 is 0.337 micron. If the distance between the gate is 0.62 micron, the depletion region will shut off the channel current flowing through the N-regions 115. Under this circumstances the channel will be opened when the depletion regions shrink from both sides of the gates by a distance of 0.07 micron. A forward bias of 0.6 volt at the gate will open a distance of 0.24 micron with a forward current density at the gate around one-amper/cm2. The resistivity between the electrodes is around $0.5 \times 10E-4$ ohm. A bias of 0.1 volt between the electrodes will provide a current density of $2 \times 10E3$ amperes/cm2. A current gain of over 1000 can be achieved. By lowering the distance between the gates and by adjusting the doping concentration of the region 115, the forward bias voltage can be even reduced. The threshold voltage VT is dependent on the doping concentration of the region 115 and the distance X For normally on JFET, the current gain is even higher for shutting off to currents.

According to FIG. 2 and above description, this invention discloses a normally off JFET device supported on a substrate. The JFET device includes a gate surrounded by a depletion region. The depletion region responding to a positive bias applied to the gate to open a current path in the substrate wherein the current path in the substrate is shut off when the gate is zero biased for the normally off JFET. For normally on JFET, the depletion region responding to a negative bias applied to the gate to shut off the current For a normally on JFET transistor, the depletion regions respond to a negative bias applied to the gate to shut off the current channel.

Figure 3:
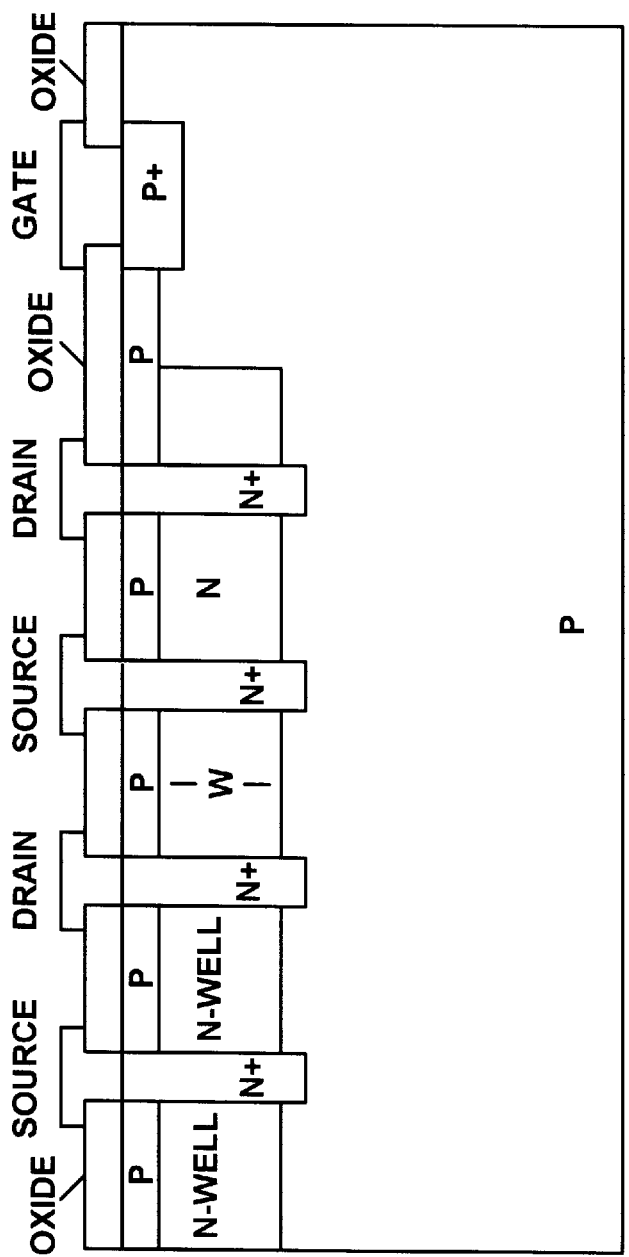
FIG. 3 is a cross sectional view of horizontal JFET device of this invention.
Figure 4A:
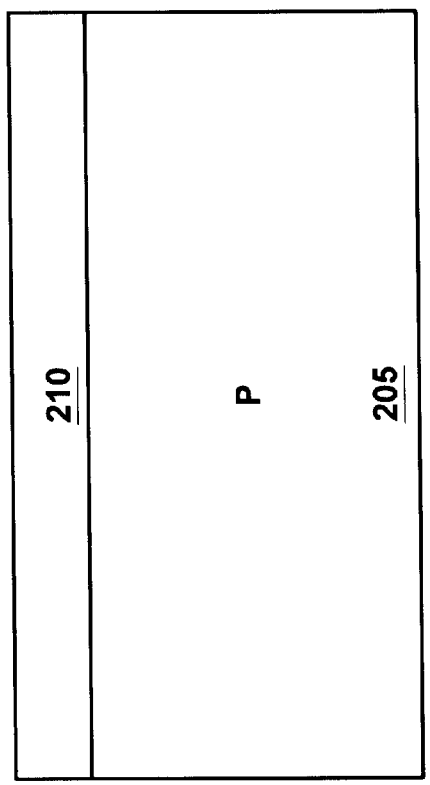
FIGS. 4A to 4E are a series of cross sectional views for illustrating the processing steps for manufacturing a JFET device of FIG. 3.
Figure 4B:
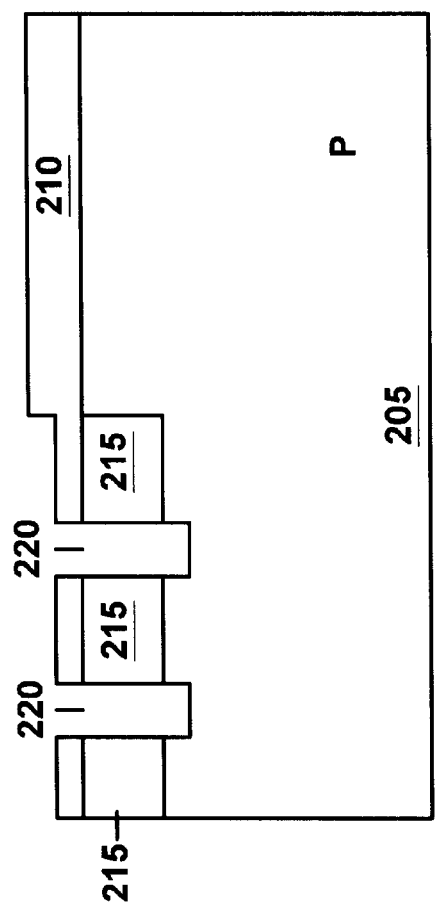
Figure 4C:
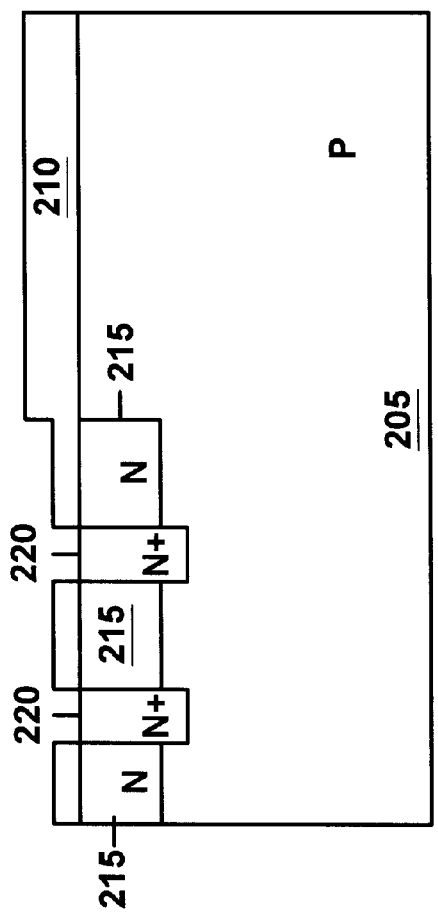

Refer to FIG. 3 for a horizontal JFET transistor 200 of this invention. The JFET transistor 200 is manufactured by applying basic processing steps commonly applied for making CMOS integrated circuit (IC). FIGS. 4A to 4E are a series of cross sectional views for illustrating the processing steps to manufacture the transistor 200. In FIG. 4A, a thick oxide layer 210 is first grown on a p-type substrate 205. In FIG. 4B, an active mask (not shown) is employed to define the active area by etching the thick oxide layer 210. An N-well implant is carried out on P-type silicon substrate 205 with a phosphorous ion flux with a flux density of $2 \times 10E11$ to 10E15/cm2. The implant flux has an energy level of 120 Kev to 1.0 Mev. Then, an implant anneal is performed to form deep N-well 215 with a depth from 0.75 to 2 microns in the substrate 205. Referring to FIG. 4C, after the N-well implant, trench mask (not shown) is used to etch a plurality of trenches 220 followed by depositing N-type polysilicon into the trenches and then etching back to form the N-type source and drain regions 220'. The trenches may be filled with tungsten metal to lower the source/drain terminal resistance. After stripping the thin oxide layer formed during implant anneal and after stripping the thick oxide layer, a blank phosphorous implant with flux between $1 \times 10E12$ to $1 \times 10E14/cm2$ at an energy of about 60 Kev is applied to form the control gate 225.

Figure 4D:
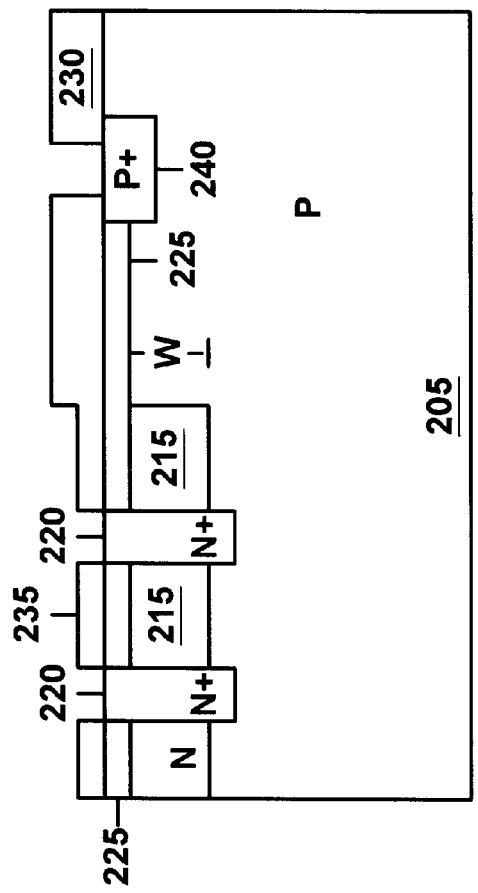
Figure 4E:
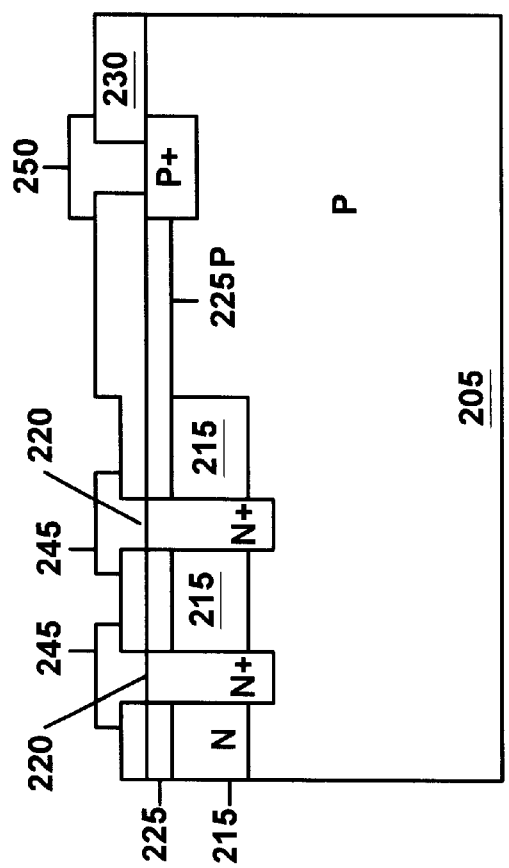

Referring to FIG. 4D, a thermal oxide or CVD oxide layer 230 is grown to cover the entire top surface. A contact mask (not shown) is employed to open the gate and source/drain contact opening 235 followed by performing a p+ implant to form the p+ region and implant annealing to form a gate-contact p+ region 240 to reduce the ohmic contact resistance for the gate metal. Then a metal layer is formed on top followed by applying a metal mask to etch and pattern the metal layer to form the source/drain metal 245 and gate metal 250.

Figure 5A:
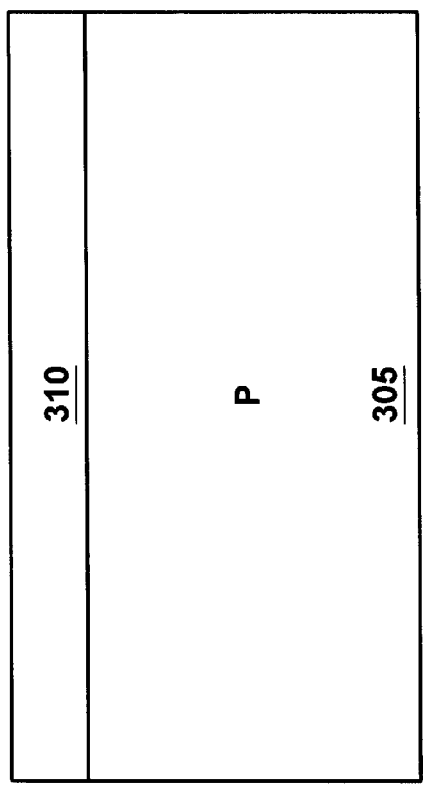
FIGS. 5A to 5E are a series of cross sectional views for illustrating the processing steps for manufacturing a JFET device with Schottky barrier functioning as top gate.
Figure 5B:
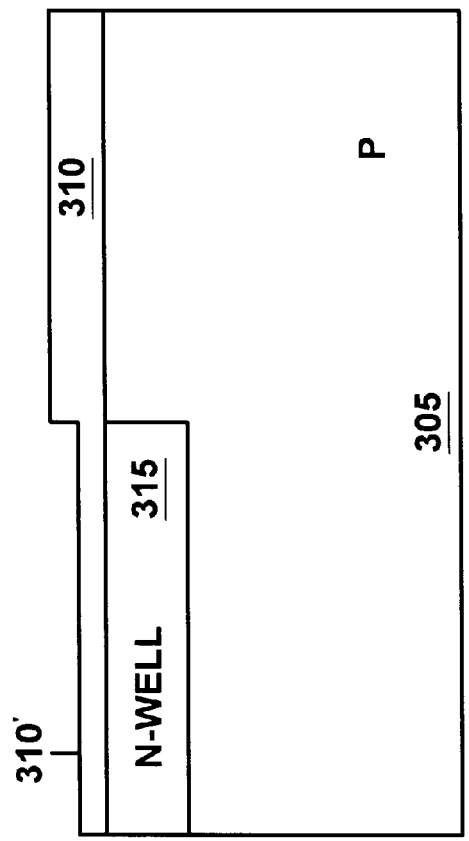
Figure 5C:
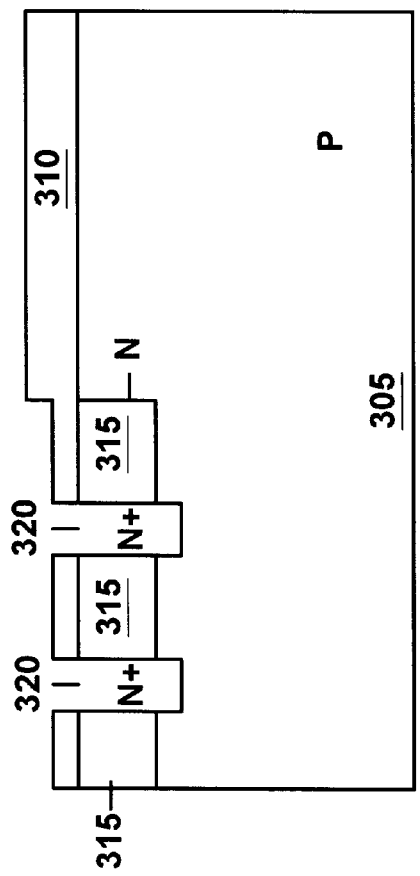
Figure 5D:
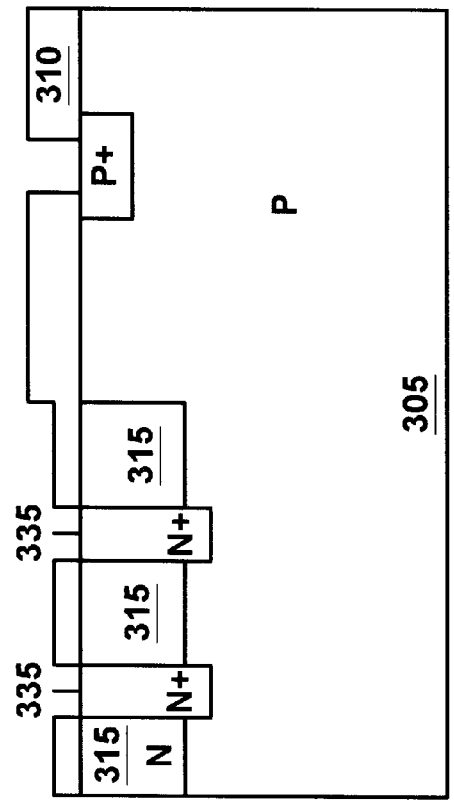
Figure 5E:
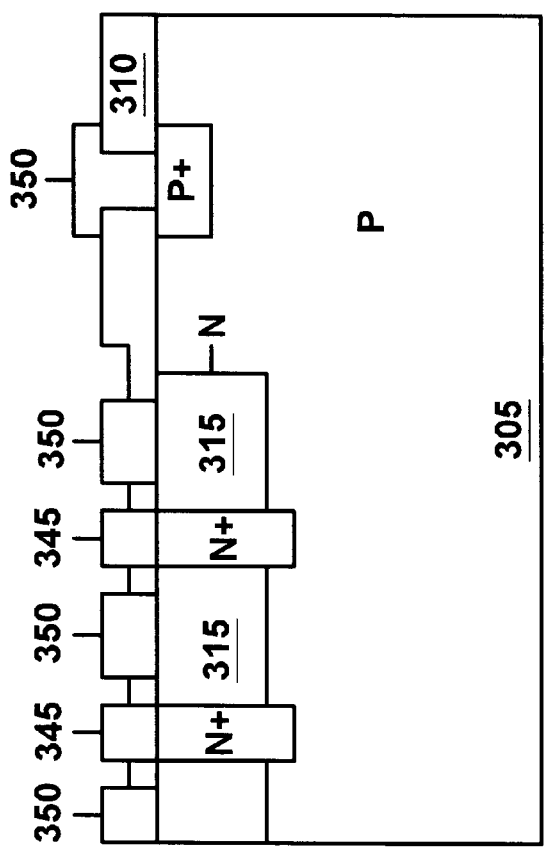

Referring to FIGS. 5A to 5E for a series of cross sectional view to show the processing steps for manufacturing another preferred embodiment of this invention. In FIG. 5A, a thick oxide layer 310 is thermally grown on a p-type substrate 305. In FIG. 5B, an active mask (not shown) is employed to define the active area by etching partially the thick oxide layer 310 in the active area thus forming a thin oxide layer 310' in the active layer after an implant anneal. An N-well implant is carried out on the P-type silicon substrate 305 with a phosphorous ion flux with a flux density of $2 \times 10E11$ to $1 \times 10E15/cm2$ at an energy of 120 Kev to 1 Mev. Then, an implant anneal is performed to form deep N-well 315 with a depth from 0.5 to 2 microns in the substrate 305. The depth of the N-well is a function of the N-well drive-in temperature and time. Referring to FIG. 5C, after the N-well implant, a trench mask 318 is used to etch a plurality of trenches 320 deeper than the N-well 315 followed by depositing N-type polysilicon into the trenches and then etching back to form the N-type source and drain regions 320'. The thin oxide layer 310' is stripped. Referring to FIG. 5D, a thermal or a CVD oxide layer 330 is formed to cover the entire top surface. A contact mask (not shown) is employed to open the gate and source/drain contact opening 335 followed by performing a p+ implant to form the p+ region and implant annealing to form a gate-contact p+ region 340 to reduce the ohmic contact resistance for the gate metal. Then a thermal oxide layer 342 is grown. A Schottky mask is used to open a plurality of Schottky contact openings. A metal layer is formed on top followed by applying a metal mask to etch and pattern the metal layer to form the source/drain metal 345 and Schottky gate metal 350. The Schottky barrier is formed for the top gate 350 for faster switching speed. The Schottky barrier height can be increased by performing a low energy boron or boron silicon implant at 5 to 10 Kev with an ion flux of 1×10E10 to 10E11/cm2 prior to metal deposition. It can also be achieved by implanting through a layer of oxide with thickness between 100 to 500 Angstroms by using a higher energy boron beam. Different metal/silicon or silicide/silicon systems can also be used to increase the barrier height.

Figure 6A:
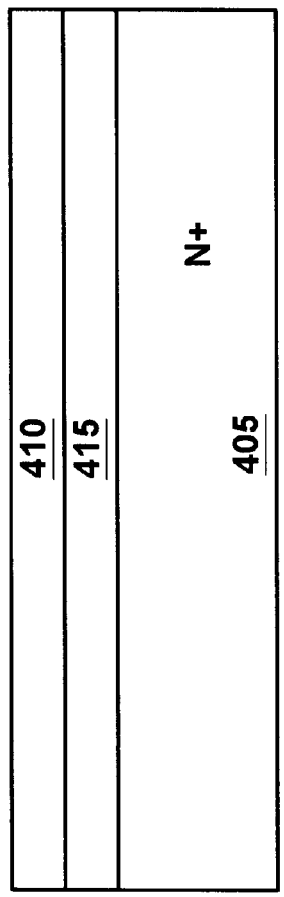
FIGS. 6A to 6F are a series of cross sectional views for illustrating the processing steps for manufacturing a JFET device by using high energy implant method to form buried gates.
Figure 6B:
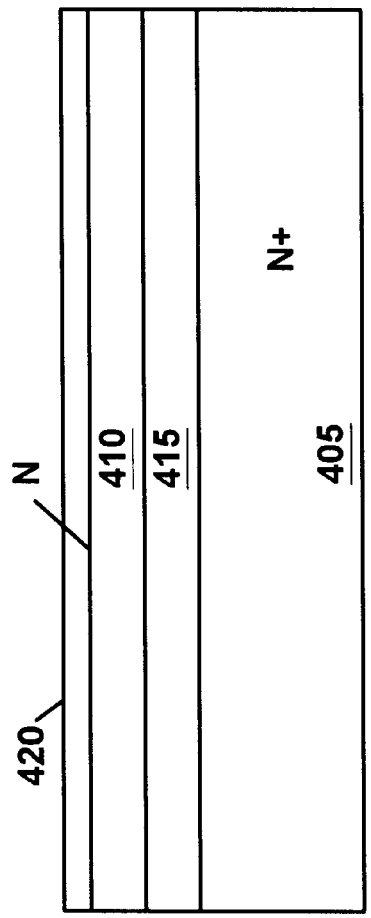
Figure 6C:
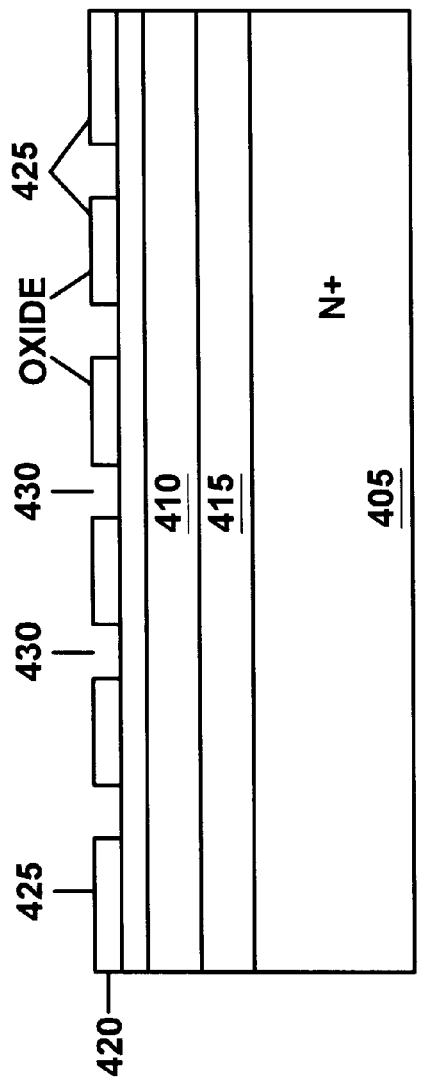
Figure 6D:
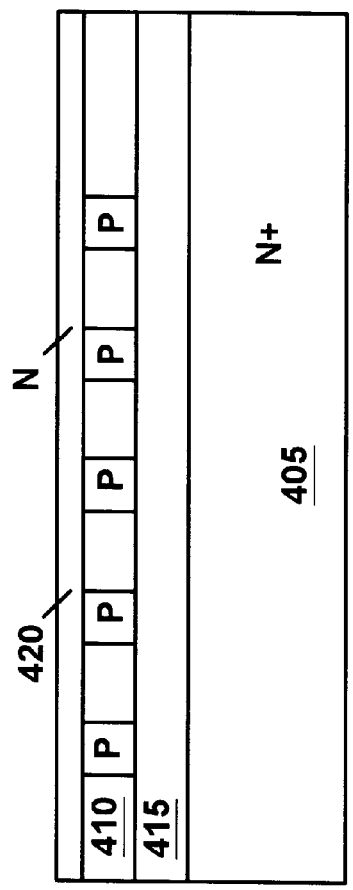
Figure 6E:
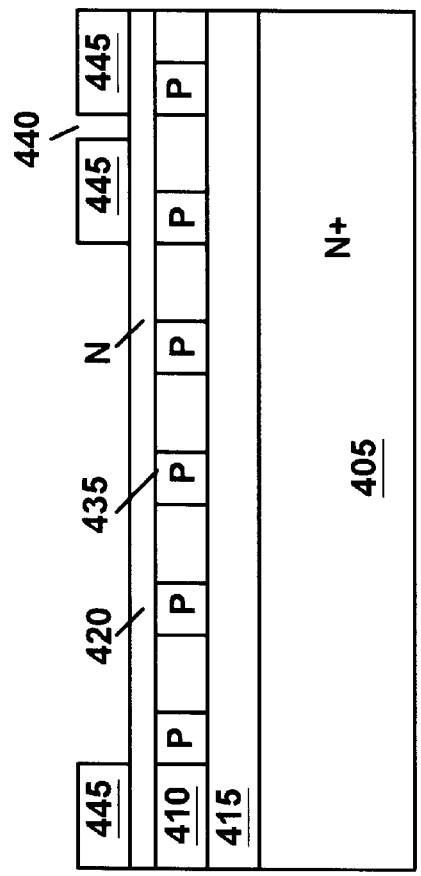
Figure 6F:
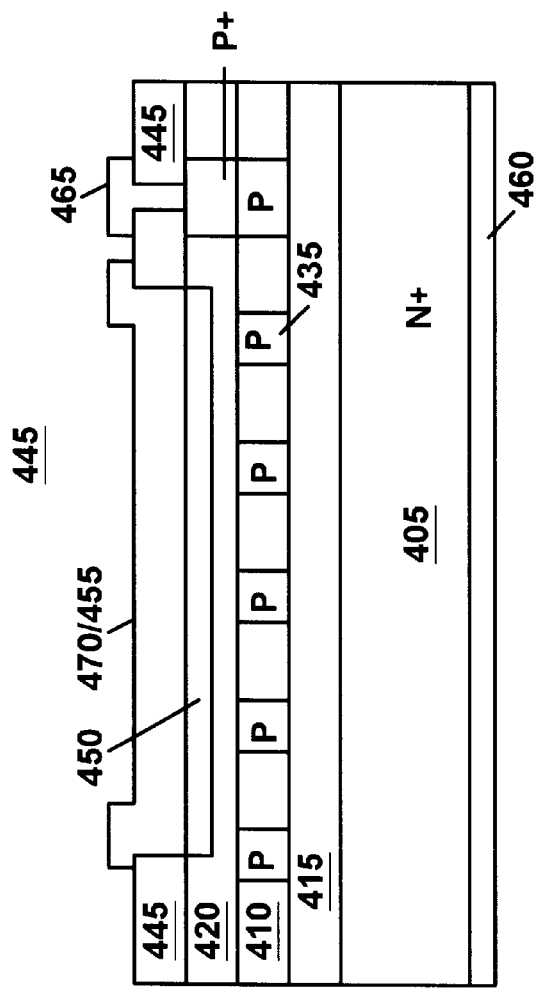

Referring to FIGS. 6A to 6F for a series of cross sectional views to illustrate the processing steps for manufacturing a power transistor of this invention. An N—N- double-epitaxial layer, i.e., epitaxial layers 410 and 415, are formed on top of a N+ substrate 405 with N-type dopant with resistivity below 0.015 ohm-cm. The N epitaxial layer 410, with a thickness of approximately 0.5 to 2 microns, is doped with N-type dopant with doping concentration of 1×10E16 to 5×10E17/cm3. The N-epitaxial layer 415, with a thickness of approximately 1 to 5 microns, is doped with N-type dopant with doping concentration of 1×10E14 to 5×10E17/cm3. In FIG. 6B, a phosphorous implant is carried out to form an N layer 420. In FIG. 6C, an oxide 425 is grown and patterned with an implant mask (not shown) to open a plurality of implant windows 430.

Referring to FIG. 6C, a high-energy boron implant with ion flux of 1×10E12 to 5×10E15/cm2 is carried out with ion energy of 250 Kev to over 1 Mev to form an array of gate array 435 in the N-layer 415. A connection implant of P-type is carried out for providing a connection-doping region 440 from the gate grid array 435 to the top surface above the N layer 420. An oxide layer 445 is then formed and a N+ mask (not shown) is employed to etch the oxide layer 445. A shallow low-energy high-dose phosphorous N+ implant is performed to form a shallow N+ layer 450. Applying a surface diffusion source such as POCl3 can also form this shallow N+ layer 450. A contact mask (not shown) is applied to open a plurality of contact openings followed by carrying out a metallization to form a top metal layer 455 and bottom metal layer 460. A metal mask is then used to pattern the top metal layer 455 to form a plurality of gate metals 465 and source metals 470 where the gate metal 465 is in electrical contact with the buried gate regions 435 through the connection region 440.

Referring to FIGS. 7A to 7F for a series of cross sectional view for illustrating the processing steps to manufacture a vertical JFET power transistor with pillar gates of this invention.

Figure 7A:
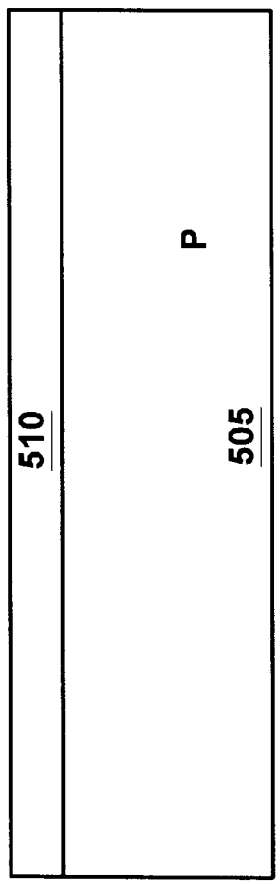
FIGS. 7A to 7F are a series of cross sectional views for illustrating the processing steps for manufacturing a vertical JFET device with pillar gates by using via/trench processes.
Figure 7B:
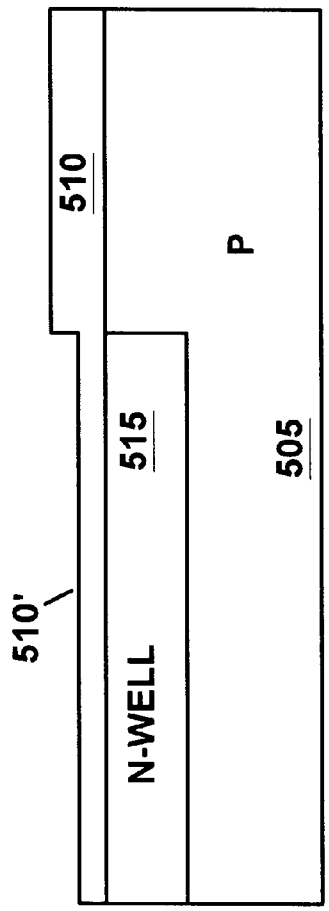
Figure 7C:
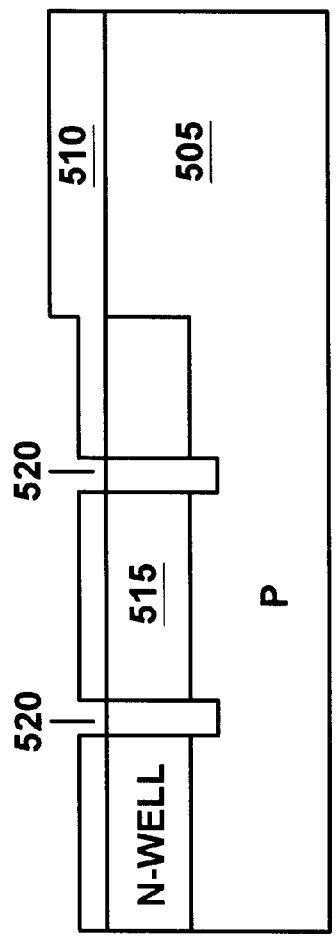
Figure 7D:
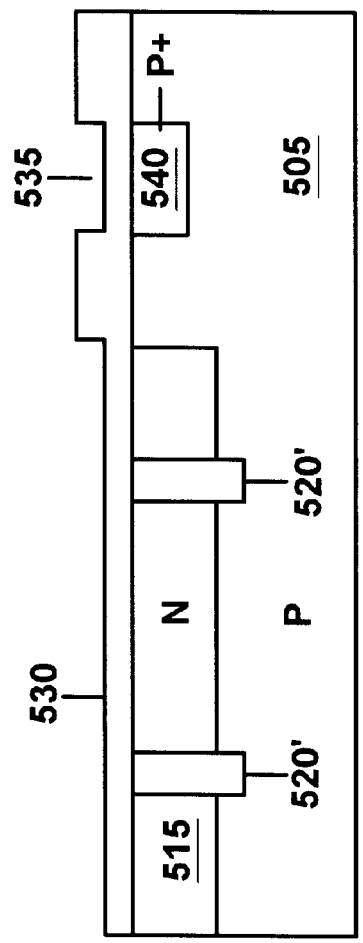
Figure 7E:
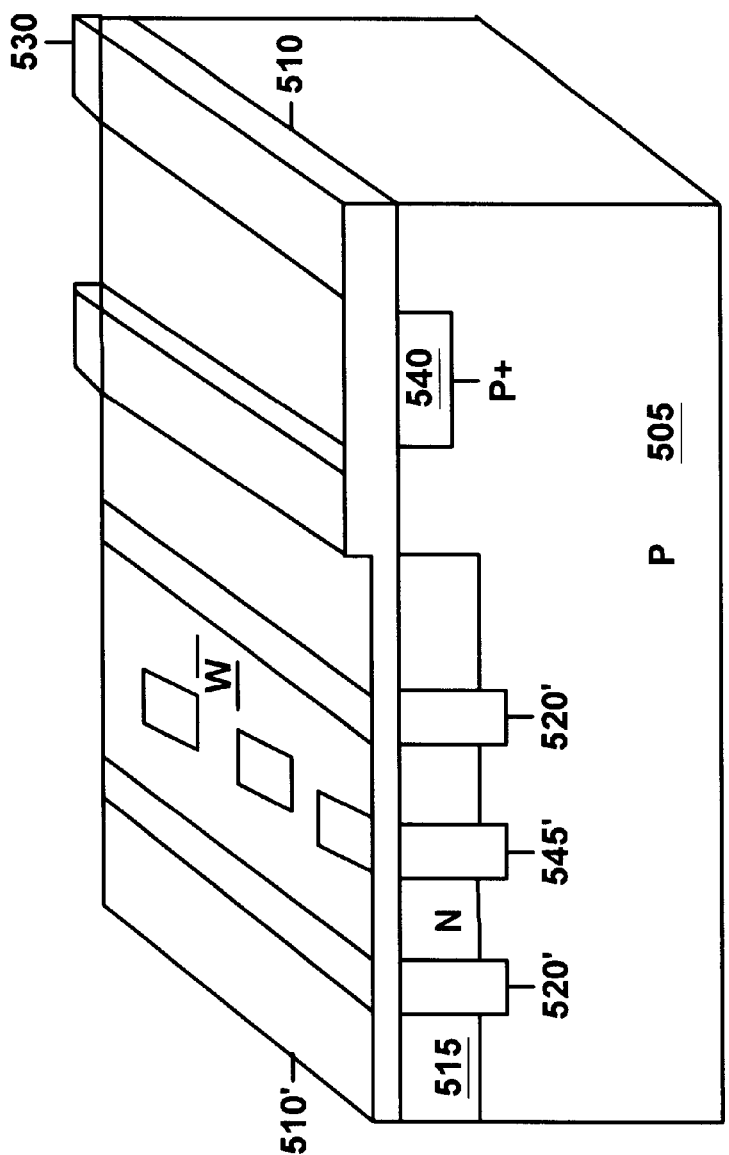
Figure 7F:
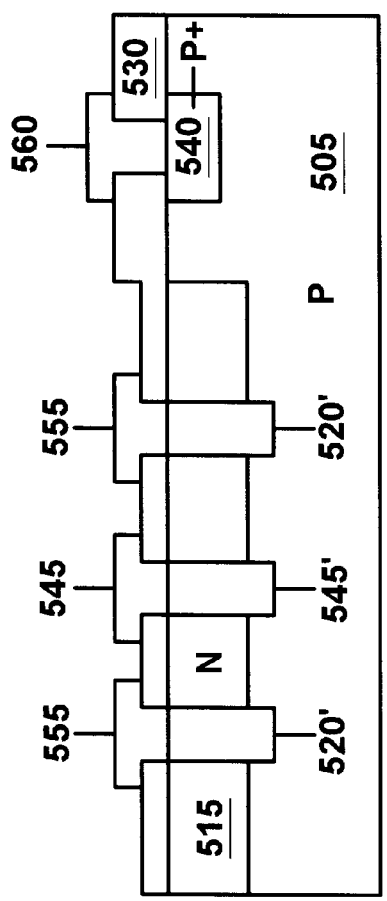

In FIG. 7A, a thick oxide layer 510 is thermally grown on a p-type substrate 505. In FIG. 7B, an active mask (not shown) is employed to define the active area by etching the thick oxide layer 510 in the active area and a thin oxide layer 510' is formed after the implant and drive-in processes in the active layer. An N-well implant is carried out on the P-type silicon substrate 505 with a phosphorous ion flux with a flux density of 1×10E12 to 1×10E15/cm2 at an energy of 120 Kev to more than 1 Mev. Then, an implant anneal is performed to form deep N-well 515 with a depth from 0.5 to 2.0 microns in the substrate 505. The depth of the N-well is a function of the N-well drive-temperature and drive-in time. Referring to FIG. 7C, after the N-well implant, a trench mask (not shown) is used to etch a plurality of trenches 520 deeper than the N-well 515 followed by depositing N+ type polysilicon into the trenches and then etching back to form the N-type source and drain regions 520'. For large current density operation, the trenches may be filled with tungsten or other types of metallic materials after a thin layer of doped polysilicon deposition. The thin oxide layer 510' is stripped. A thermal oxide layer or CVD oxide layer 530 is formed on the top surface. Referring to FIG. 5D, a contact mask (not shown) is employed to open the gate contact opening 535 followed by performing a p+ implant to form the p+ region and implant annealing to form a gate-contact p+ region 540 to reduce the ohmic contact resistance for the gate metal. A via mask (not shown) is employed to etch a plurality of vias 545 with aspect ration higher than 20:1. These vias 545 that are deeper than the N-well 515 are then filled with P+ polysilicon 545'. Then a thermal oxide layer 550 is grown. A contact mask (not shown) is used to etch a plurality of contact openings. A metal layer is formed on top followed by applying a metal mask to etch and pattern the metal layer to form the source/drain metal 555 and gate metal 560. The power transistor 500 has deep vertical gate to save the real estate of the silicon wafer and meantime, a high current density can be achieved.

Figure 8A:
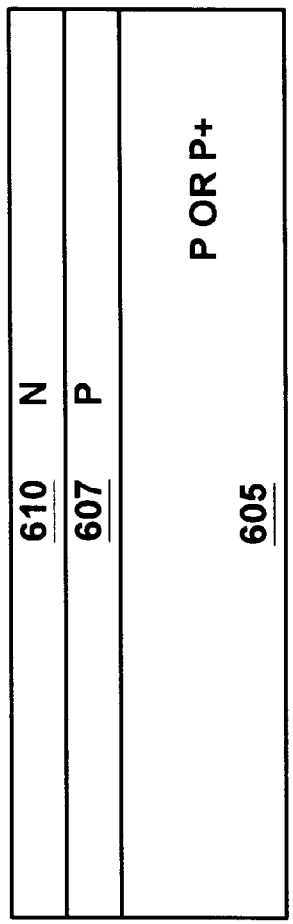
FIGS. 8A to 8E are a series of cross sectional views for illustrating the processing steps for manufacturing an alternate JFET device by using the via/trench processes.
Figure 8B:
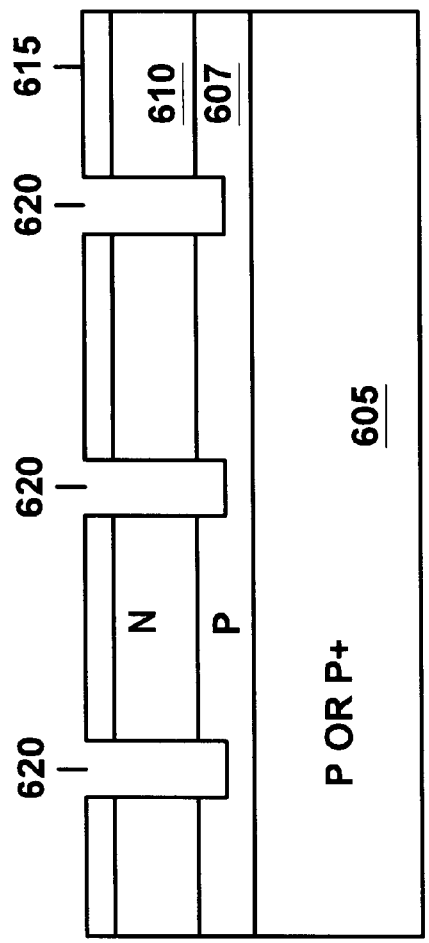
Figure 8C:
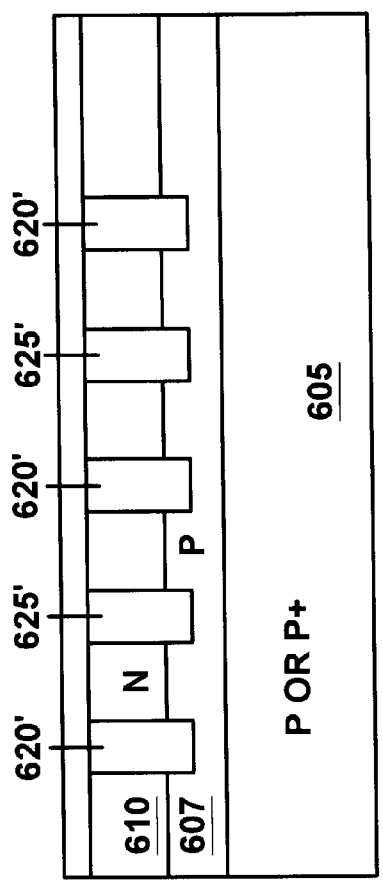
Figure 8D:
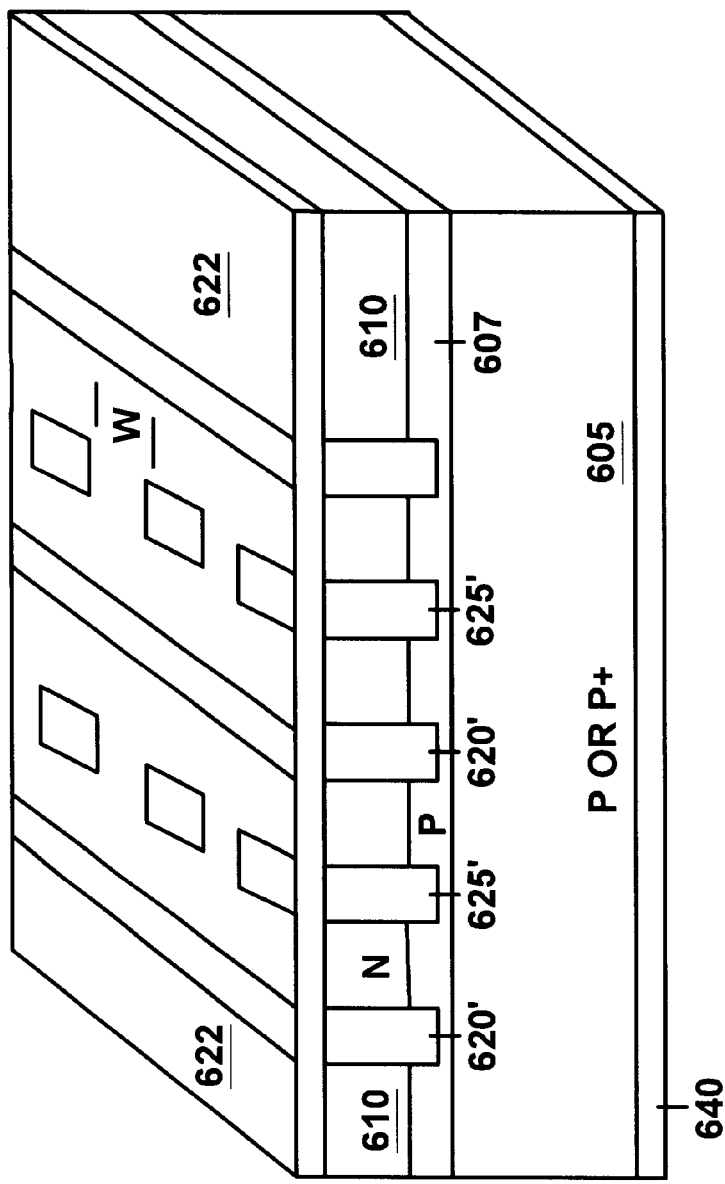
Figure 8E:
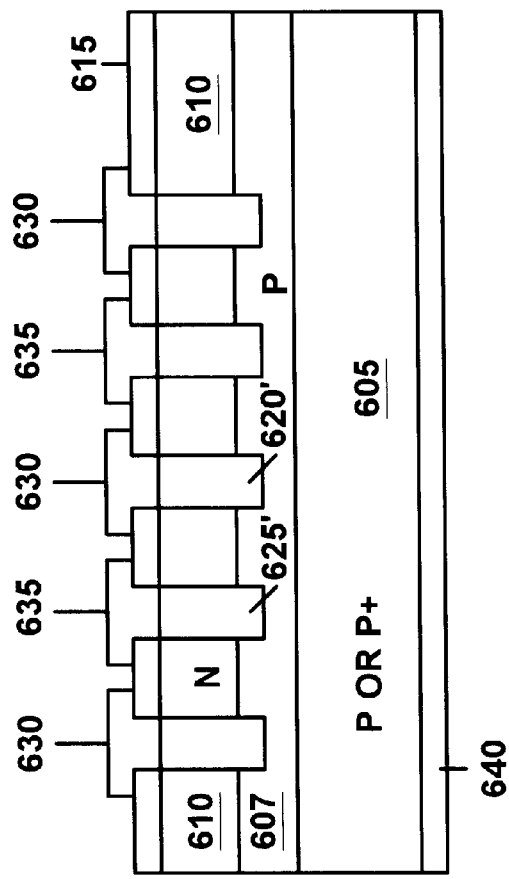

Referring to FIGS. 8A to 8E for a series of cross sectional views for illustrating the processing steps to manufacture a vertical JFET power transistor with pillar gates of this invention. In FIG. 8A, an p-type epitaxial layer 607 layer is formed on a p+ substrate 605. A N-type epitaxial layer 610 is formed over the top surface of the P-type epitaxial layer 607. The depth of the N-type epitaxial layer 610 ranges from 0.5 to 20 microns. In FIG. 8B, an oxide layer 615 is grown over the N-type epitaxial layer 610. A trench mask (not shown) is employed to open a plurality of trenches 620 with the depth of the trenches greater than the depth of the N-type epitaxial layer 610. In FIG. 8C, the trenches are filled with polysilicon. The trench mask and the top oxide layer are stripped and the polysilicon are etched back to form the source or drain regions 620'. Another of oxide layer 622 is grown on the top surface. In FIG. 8D, a via mask (not shown) is applied to etch a plurality of vias 625. The vias 625 are then filled with P+ polysilicon to form a plurality of P+ gates 625'. A contact mask (not shown) is then used to open a plurality of contact openings. A layer of metal is deposited and then a metal mask is employed to pattern the metal layer to function as drain and source metal 630 and gate metal 635. A metal layer 640 is also formed on the backside of the substrate. The distance between the gates 625' ranging from 0.3 to 5 microns which is a function of the doping concentration of the N-type epitaxial layer 610. The doping concentration of the N-type epitaxial layer 610 can have range between 10E13 to 5×10E16/cm3. For transistors employed for very high current density operation, the trenches may be filled with a thin layer of doped polysilicon then filled with tungsten or other types of metallic materials.

Referring to FIG. 9 for a diagram for illustrating the functional relationship between the threshold voltage VTh for turning on a JFET device of this invention as a function of the distance W between the gates and the channel doping concentration. The threshold voltage VTh for turning on the JFET transistor decreases as the width W between the gates becomes larger. Conversely, for a constant width W between the gates, the threshold voltage VTh increases as the channel doping concentration C is decreased. A normally off JFET transistor with constant channel doping concentration C will become a normally on device when the width between the gates increases and the threshold voltage VTh decreases below zero. Similarly, for a constant width W between the gates, a normally off JFET transistor will become a normally on device by increasing the channel doping concentration C.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method for fabricating a horizontal junction field effect transistor on a p-type substrate comprising:
   growing a thick first oxide layer on said p-type substrate;
   etching said thick oxide layer to define an active area;
   performing an N-well ion implantation;
   annealing said p-type substrate to produce an N-well;
   etching a plurality of trenches through said N-well;
   filling said plurality of trenches with N-type polysilicon;
   etching back said polysilicon to form source and drain regions;
   stripping said first oxide layer;
   performing a phosphorus implant to form a control gate;
   forming a second oxide layer to cover the top surface of the substrate;
   forming gate, source, and drain contact openings in said second oxide layer;
   performing a $P^+$ implant and anneal to form a gate contact $P^+$ region;
   forming a metal layer on top of the substrate; and,
   etching said metal layer to form source/drain metal contacts and gate metal contacts.

2. The method of claim 1, further including performing an N-well ion implantation with a phosphorus ion flux density of $2\times10^{11}/cm^2$ to $10^{15}/cm^2$ and an implant energy of 120 Kev to 1.0 Mev.

3. The method of claim 1, further including producing an N-well with a depth from 0.75 to 2 microns.

4. The method of claim 1, further including performing a phosphorus implant to form a control gate using a flux density of $1\times10^{12}/cm^2$ to $1\times10^{14}/cm^2$ at an energy of about 60 Kev.

5. A method for fabricating a horizontal field effect transistor on a p-type substrate comprising:
   thermally growing a thick oxide layer on said p-type substrate;
   partially etching said thick oxide layer to define an active area;
   performing an N-well ion implantation;
   annealing said p-type substrate to produce an N-well;
   etching a plurality of trenches through said N-well;
   filling said plurality of trenches with N-type polysilicon;
   etching back said polysilicon to form source and drain regions;
   stripping said first oxide layer;
   forming a second oxide layer to cover the top surface of the substrate;
   performing a $P^+$ implant and anneal to form a gate contact $P^+$ region;
   forming a third oxide layer;
   forming a plurality of Schottky contact openings in said third oxide layer;
   forming a metal layer on top of the substrate; and,
   etching said metal layer to form source/drain metal contacts and Schottky gate metal contacts.

6. The method of claim 5, further including producing an N-well with a depth from 0.5 to 2 microns.

7. The method of claim 5, further including performing a low energy boron implant at 5 to 10 Kev.

8. The method of claim 5, further including performing an N-well ion implantation with a phosphorus ion flux density of $2\times10^{11}/cm^2$ to $10^{15}/cm^2$ and an implant energy of 120 Kev to 1.0 Mev.

9. A method for fabricating a power transistor on a $N^+$ substrate comprising:
   forming a $N^-$ epitaxial layer on top of said $N^+$ substrate;
   forming a first N epitaxial layer on top of said $N^-$ epitaxial layer;
   performing a phosphorus implant to form a second N epitaxial layer in the surface of said first N epitaxial layer;
   forming a first oxide layer on said second N epitaxial layer;
   patterning said first oxide layer to open a plurality of implant windows;
   performing a high-energy boron implant to form a gate array;
   removing said first oxide layer;
   performing a P type connection implant to form a connection doping region between said gate array and the surface of said second N epitaxial layer;
   forming a second oxide layer on the surface of said second N epitaxial layer;
   forming an opening in said second oxide layer;
   perfoming a shallow implant through said opening to form a shallow $N^+$ layer;
   forming a plurality of contact openings in said second oxide layer; and,
   forming a plurality of gate metal contacts and source metal contacts.

10. The method of claim 9, further including forming a $N^-$ epitaxial layer having a doping concentration of $1\times10^14$ to $5\times10^{17}/cm^3$ and a thickness of approximately 1 to 5 microns on toy of said $N^+$ substrate.

11. The method of claim 9, further including forming a first N epitaxial layer having a doping concentration of $1\times10^{16}$ to $5\times10^{17}/cm^3$ and a thickness of approximately 0.5 to 2 microns on top of said $N^-$ layer.

12. The method of claim 9, further including performing a high energy boron implant with a flux of $1\times10^{12}$ to $5\times10^{15}/cm^2$ at an energy greater than 250 Kev.

13. A method for fabricating a vertical junction field effect transistor with pillar gates on a P type substrate comprising;
   forming a first oxide layer on said P type substrate;

etching said first oxide layer to define an active area;
performing an N-well implant;
performing an implant anneal to form an N-well;
etching a plurality of trenches through said N-well;
depositing N⁺ polysilicon into said trenches;
etching back said N+ polysilicon to form source and drain regions;
stripping said first oxide layer;
forming a second oxide layer on said P type substrate;
forming a gate contact opening;
performing a P⁺ implant to form a gate contact P⁺ region;
etching a plurality of vias through said N-well;
filling said vias with P⁺ polysilicon;
growing a thermal oxide layer;
opening a plurality of contact windows in said thermal oxide layer; and,
forming source, drain, and gate metal contacts in said plurality of contact windows.

14. The method of claim 13, wherein said N-well has a depth from 0.5 to 2.0 microns.

15. The method of claim 13, further including performing an N-well implant with a phosphorus ion flux density of $1\times10^{12}$ to $1\times10^{15}/cm^2$ at an energy of 120 Kev.

16. The method of claim 13, further including filling said plurality of trenches with tungsten after a thin layer of doped polysilicon deposition.

17. A method for fabricating a vertical junction field effect transistor (JFET) in a P⁺ type substrate comprising;

forming a P type epitaxial layer on said P⁺ type substrate;
forming a N type epitaxial layer on said P type epitaxial layer;
forming a first oxide layer on said N type epitaxial layer;
etching a plurality of trenches through said N type epitaxial layer into said P type epitaxial layer;
filling said plurality of trenches with polysilicon;
stripping said first oxide layer;
forming a second oxide layer;
etching a plurality of vias in said second oxide layer;
filling said plurality of vias with P⁺ polysilicon to form a plurality of P⁺ gates;
opening a plurality of contact openings in said second oxide;
forming drain, source and gate metal contacts in said contact openings; and,
forming a backside metal contact.

18. The method of claim 17, wherein the thickness of said N type epitaxial layer is the range of 0.5 to 20 microns.

19. The method of claim 17, wherein the doping concentration of said N type epitaxial layer is in the range of $1\times10^{15}$ to $5\times10^{16}/cm^3$.

20. The method of claim 17 wherein said plurality of trenches are filled with polysilicon and tungsten.

* * * * *